(12) United States Patent  
Jou et al.

(10) Patent No.: US 10,439,721 B2  
(45) Date of Patent: Oct. 8, 2019

(54) OPTICAL INTERCONNECT MODULES WITH AWG POLYMER WAVEGUIDE ON SILICON SUBSTRATE

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/965,213

(22) Filed: Apr. 27, 2018

(65) Prior Publication Data

US 2018/0337743 A1 Nov. 22, 2018

Related U.S. Application Data

(60) Provisional application No. 62/508,940, filed on May 19, 2017, provisional application No. 62/509,892, filed on May 23, 2017.

(51) Int. Cl.
*H04B 10/25* (2013.01)
*G02B 6/42* (2006.01)
(Continued)

(52) U.S. Cl.
CPC ......... *H04B 10/25* (2013.01); *G02B 6/12011* (2013.01); *G02B 6/428* (2013.01);
(Continued)

(58) Field of Classification Search
CPC ...... H04B 10/506; H04B 10/25; H04B 10/67; H04J 14/02; G02B 6/12009–12033; G02B 6/42–43
See application file for complete search history.

(56) References Cited

U.S. PATENT DOCUMENTS 5,282,080 A 1/1994 Scifres et al.
5,416,861 A 5/1995 Koh et al.
(Continued)

FOREIGN PATENT DOCUMENTS

WO WO 2018/213037 A1 11/2008
WO WO 2018/213035 A1 11/2018
(Continued)

OTHER PUBLICATIONS

Vlasov, Silicon CMOS-Integrated Nano-Photonics for Computer and Data Communications Beyond 100G (published in IEEE Communication Magazine, vol. 50, Issue 2, Feb. 2012, pp. s67-s72).*
(Continued)

*Primary Examiner* — Casey L Kretzer
(74) *Attorney, Agent, or Firm* — Alston & Bird LLP (57) ABSTRACT

An optical interconnect system has a transmitter and a receiver connected by a single mode fiber. An array of DML lasers in the transmitter emits multiple wavelengths which are multiplexed to the single mode fiber with an array waveguide grating (AWG) device. The receiver demultiplexes the different wavelengths by an AWG polymer waveguide fabricated in a trench on the silicon surface. The AWG demultiplexer includes a high-NA polymer waveguide which has an end reflector approximately formed at 45 degrees for reflecting light from AWG into multiple photodetectors assembled outside the trench. Optionally, a number of through-silicon-vias (TSVs) allow electrical connection access to the lasers and the driver circuit from the backside of the silicon substrate by external power sources.

4 Claims, 5 Drawing Sheets (51) Int. Cl.
*G02B 6/12* (2006.01)
*H04B 10/50* (2013.01)
*H04B 10/67* (2013.01)
*H04J 14/02* (2006.01)
*H05K 1/02* (2006.01)
*H01S 5/022* (2006.01)
*H01S 5/183* (2006.01)
*H05K 1/18* (2006.01)

(52) U.S. Cl.
CPC .......... *H01S 5/02284* (2013.01); *H01S 5/183* (2013.01); *H04B 10/506* (2013.01); *H04B 10/67* (2013.01); *H04J 14/02* (2013.01); *H05K 1/0274* (2013.01); *H01S 5/02292* (2013.01); *H05K 1/189* (2013.01); *H05K 2201/10121* (2013.01); *H05K 2201/10151* (2013.01)

(56) References Cited

U.S. PATENT DOCUMENTS

| | | | |
|---|---|---|---|
| 5,446,814 | A | 8/1995 | Kuo et al. |
| 5,485,021 | A | 1/1996 | Abe |
| 6,036,956 | A | 3/2000 | Jacob et al. |
| 6,049,639 | A | 4/2000 | Paniccia et al. |
| 6,052,498 | A | 4/2000 | Paniccia |
| 6,243,508 | B1 | 6/2001 | Jewell et al. |
| 6,330,377 | B1 | 12/2001 | Kosemura |
| 6,393,169 | B1 | 5/2002 | Paniccia et al. |
| 6,403,393 | B1 | 6/2002 | Adkisson et al. |
| 6,456,765 | B1 | 9/2002 | Klocek et al. |
| 6,549,708 | B2 | 4/2003 | Worchesky et al. |
| 6,587,605 | B2 | 7/2003 | Paniccia et al. |
| 6,731,856 | B1 | 5/2004 | Fujita et al. |
| 6,845,184 | B1 | 1/2005 | Yoshimura et al. |
| 7,218,809 | B2 | 5/2007 | Zhou et al. |
| 7,266,262 | B2 | 9/2007 | Ogawa |
| 7,529,439 | B2 | 5/2009 | Kim et al. |
| 7,627,204 | B1 | 12/2009 | Deane |
| 8,135,248 | B2 | 3/2012 | Hodono |
| 9,036,956 | B2 | 5/2015 | Tseng et al. |
| 9,086,551 | B2 | 6/2015 | Heroux |
| 9,310,575 | B2 | 4/2016 | Matsuda |
| 9,341,797 | B2 | 5/2016 | Nakagawa et al. |
| 2001/0031109 | A1 | 10/2001 | Paniccia et al. |
| 2001/0038737 | A1 | 11/2001 | Imada et al. |
| 2002/0018507 | A1 | 2/2002 | Deacon |
| 2002/0028045 | A1 | 3/2002 | Yoshimura et al. |
| 2002/0036356 | A1 | 3/2002 | Teshima |
| 2002/0114587 | A1 | 8/2002 | Golwalkar et al. |
| 2003/0015770 | A1 | 1/2003 | Talin et al. |
| 2003/0223673 | A1 | 12/2003 | Garito et al. |
| 2004/0109654 | A1 | 6/2004 | Feger et al. |
| 2004/0264837 | A1 | 12/2004 | Ogawa |
| 2005/0031265 | A1 | 2/2005 | Simon et al. |
| 2005/0041906 | A1 | 2/2005 | Sugama et al. |
| 2005/0063636 | A1 | 3/2005 | Joyner |
| 2005/0185900 | A1 | 8/2005 | Farr |
| 2005/0201707 | A1 | 9/2005 | Glebov |
| 2006/0045418 | A1 | 3/2006 | Cho et al. |
| 2008/0031583 | A1 | 2/2008 | Ohtsu et al. |
| 2008/0037934 | A1 | 2/2008 | Daikuhara et al. |
| 2009/0060526 | A1 | 3/2009 | Matsui et al. |
| 2009/0072393 | A1 | 3/2009 | Bachman |
| 2009/0202713 | A1 | 8/2009 | Pitwon |
| 2009/0218519 | A1 | 9/2009 | McLeod |
| 2010/0032853 | A1 | 2/2010 | Naitou |
| 2010/0104290 | A1 | 4/2010 | Nobuhara et al. |
| 2010/0213561 | A1 | 8/2010 | Assefa et al. |
| 2010/0215313 | A1 | 8/2010 | Matsuoka et al. |
| 2010/0226655 | A1 | 9/2010 | Kim |
| 2011/0030778 | A1 | 2/2011 | Takacs et al. |
| 2011/0133063 | A1 | 6/2011 | Ji et al. |
| 2011/0229080 | A1* | 9/2011 | Bulthuis ............ G02B 6/12011 385/37 |
| 2012/0076454 | A1 | 3/2012 | Shiraishi |
| 2012/0177381 | A1 | 7/2012 | Dobbelaere |
| 2012/0314990 | A1 | 12/2012 | Pitwon et al. |
| 2013/0064494 | A1* | 3/2013 | Bolle ................. G02B 6/12014 385/14 |
| 2013/0182998 | A1 | 6/2013 | Andry et al. |
| 2013/0223789 | A1 | 8/2013 | Lee |
| 2014/0112616 | A1 | 4/2014 | Numata |
| 2014/0140657 | A1 | 5/2014 | Shiraishi |
| 2014/0294342 | A1 | 10/2014 | Offrein |
| 2014/0321804 | A1 | 10/2014 | Thacker et al. |
| 2014/0355931 | A1 | 12/2014 | Tummala et al. |
| 2015/0043919 | A1* | 2/2015 | Handelman ............. H04J 14/02 398/79 |
| 2015/0117824 | A1 | 4/2015 | Wang et al. |
| 2015/0168646 | A1 | 6/2015 | Arai |
| 2015/0303649 | A1* | 10/2015 | Weber .................. H01S 5/0261 362/259 |
| 2015/0333831 | A1 | 11/2015 | Lai et al. |
| 2015/0362673 | A1 | 12/2015 | Zheng et al. |
| 2015/0362676 | A1 | 12/2015 | Murison et al. |
| 2016/0156999 | A1 | 6/2016 | Liboiron-Ladouceur et al. |
| 2016/0178839 | A1 | 6/2016 | Tsujita |
| 2016/0349451 | A1* | 12/2016 | Shen ..................... G02B 6/4214 |
| 2017/0017042 | A1 | 1/2017 | Menard et al. |
| 2017/0230171 | A1 | 8/2017 | Li et al. |
| 2018/0149815 | A1 | 5/2018 | Heroux et al. |
| 2018/0159627 | A1* | 6/2018 | Fazal ............... H04B 10/25752 |
| 2018/0288875 | A1* | 10/2018 | Sasaki .................... H05K 1/148 |
| 2018/0335583 | A1 | 11/2018 | Jou et al. |
| 2018/0335584 | A1 | 11/2018 | Jou et al. |
| 2018/0335585 | A1 | 11/2018 | Jou et al. |
| 2018/0335586 | A1 | 11/2018 | Jou et al. |
| 2018/0335587 | A1 | 11/2018 | Jou et al. |
| 2018/0335588 | A1 | 11/2018 | Jou et al. |
| 2018/0335589 | A1 | 11/2018 | Jou et al. |
| 2018/0335590 | A1 | 11/2018 | Jou et al. |
| 2018/0337111 | A1 | 11/2018 | Jou et al. |

FOREIGN PATENT DOCUMENTS

| | | |
|---|---|---|
| WO | WO 2018/213036 A1 | 11/2018 |
| WO | WO 2018/213038 A1 | 11/2018 |
| WO | WO 2018/213039 A1 | 11/2018 |
| WO | WO 2018/213040 A1 | 11/2018 |
| WO | WO 2018/213041 A1 | 11/2018 |
| WO | WO 2018/213042 A1 | 11/2018 |
| WO | WO 2018/213043 A1 | 11/2018 |
| WO | WO 2018/213044 A1 | 11/2018 |

OTHER PUBLICATIONS

U.S. Appl. No. 15/963,030, Non-Final Office Action dated Oct. 17, 2017.
U.S. Appl. No. 15/963,665, Notice of Allowance dated Oct. 3, 2018.
U.S. Appl. No. 15/963,780, Non-Final Office Action dated Oct. 24, 2018.
U.S. Appl. No. 15/964,701, Non-Final Office Action dated Oct. 5, 2018.
WIPO Application No. PCT/US2018/031336, PCT International Search Report and Written Opinion of the International Searching Authority dated Sep. 19, 2018.
Chen et al., "Chip-Level 1 2 Optical Interconnects Using Polymer Vertical Splitter on Silieuri Substrate," IEEE Photonics Journal, 6:1-9 (2014).[ Retrieved from the Internet on Jun. 29, 2018 <URL:https://ieeexplore.ieee.org/stamp/stamp.jsp?tp=&arnumber=67.
Shen et al., "Implementation of Chip-Level Optical Interconect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.
U.S. Appl. No. 15/963,043 , Requirement for Restriction-Election dated Jun. 29, 2018.

(56) References Cited

OTHER PUBLICATIONS

U.S. Appl. No. 15/963,440 Requirement for Restriction-Election dated Jul. 10, 2018.
U.S. Appl. No. 15/963,780, Requirement for Restriction-Election dated Jul. 27, 2018.
U.S. Appl. No. 15/964,889, Non-Final Office Action dated Jun. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031335, PCT International Search Report and Written Opinion of the International Searching Authority dated Sep. 12, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.
U.S. Appl. No. 15/963,440, Non-Final Office Action dated Dec. 19, 2018.
U.S. Appl. No. 15/964,889, Final Office Action dated Jan. 2, 2019.
U.S. Appl. No. 15/963,030, Non-Final Office Action dated Oct. 17, 2018.
U.S. Appl. No. 15/963,043, Requirement for Restriction-Election dated Feb. 25, 2019.
U.S. Appl. No. 15/964,889, Notice of Allowance dated Mar. 21, 2019.

* cited by examiner

OPTICAL INTERCONNECT MODULES WITH AWG POLYMER WAVEGUIDE ON SILICON SUBSTRATE

CROSS REFERENCE TO RELATED APPLICATIONS

This application claims the benefit of U.S. Provisional Patent Applications No. 62/508,940, titled "OPTICAL COUPLING STRUCTURE" filed May 19, 2017, and No. 62/509,892, titled "OPTICAL INTERCONNECT MODULES" filed May 23, 2017, which are incorporated by reference herein in their entirety.

FIELD

Embodiments described herein relate to optical interconnect modules, and more particularly for optical sub-assembly in optical interconnect devices.

BACKGROUND

Cloud computing, enterprise networks, and data center networks continue to drive increased bandwidth demand of optical fiber communication for metro and long haul wires, and rack-to-rack wires within data centers to 100 Gbps and beyond. Optical fiber transmission systems using single mode fibers (SMFs) are commonly utilized for such high capacity communication systems. A common optical fiber transmission system includes a side (edge) emitting laser diode such as a distributed feedback (DFB) laser coupled with a single mode fiber. Various coupling structures have been proposed to increase coupling efficiency between a distributed feedback laser and a single mode fiber. Such commonly employed coupling structures include butt coupling (direct alignment of the optical paths of) the DFB laser with the SMF, or the integration of a cylindrical lens or combination of a cylindrical lens and graded index rod lens between the DFB and waveguide, and similarly between a waveguide and SMF. However these systems have their disadvantages of being bulky and having high assembly cost. There is a need for a more compact and efficient device to replace current interconnect optical couplers.

SUMMARY

The application discloses an optical interconnect system, including: a single mode fiber having a first end connecting to a transmitter on a first silicon substrate and a second end connecting to a receiver on a second silicon substrate; wherein the transmitter comprises a plurality of laser diodes emitting different wavelengths, and multiplexes the different wavelengths into the first end of the single mode fiber; wherein the receiver inputs the different wavelengths from the single mode fiber and demultiplexes the different wavelengths into a plurality of photodetectors.

The transmitter includes a polymer array waveguide grating (AWG) multiplexer, which has an input high NA polymer element mixing the different wavelengths, a plurality of polymer waveguide gratings arranged to have different lengths, and an output high NA polymer waveguide for propagating multiple wavelength light into the single mode fiber. An optical path is formed from the plurality of laser diodes to the single mode fiber through the polymer AWG multiplexer.

The receiver comprises a trench formed on the second silicon substrate, wherein a side wall of the trench has a slanted slope. A number of photodetectors connected to a trans-impedance amplifier circuit are located in an area on the silicon surface outside the trench. An array waveguide grating (AWG) demultiplexer arranged inside the trench, the AWG demultiplexer includes an input polymer element which receives light of different wavelengths from the single mode fiber and illuminates the light into a plurality of polymer waveguide gratings; and an output high NA polymer element for demultiplexing light, and the output high NA polymer element has an end reflector for directing light into the plurality of photodetectors. An optical path is formed from the single mode fiber to the plurality of photodetectors through the polymer AWG demultiplexer.

Optionally, a number of through-silicon-vias (TSVs) allow electrical connection access to the lasers and the driver circuit from the backside of the silicon substrate by external power sources.

BRIEF DESCRIPTION OF THE DRAWINGS

Having thus described some embodiments in general terms, reference will now be made to the accompanying drawings, which are not necessarily drawn to scale.

DETAILED DESCRIPTION

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular details in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "spanning", "to", "between", and "on" as used herein may refer to a relative position of one layer with respect to other layers. One layer "over", "spanning", or "on" another layer or bonded "to" or in "contact" with another layer may be directly in contact with the other layer or may have one or more intervening layers. One layer "between" layers may be directly in contact with the layers or may have one or more intervening layers.

Figure 1:
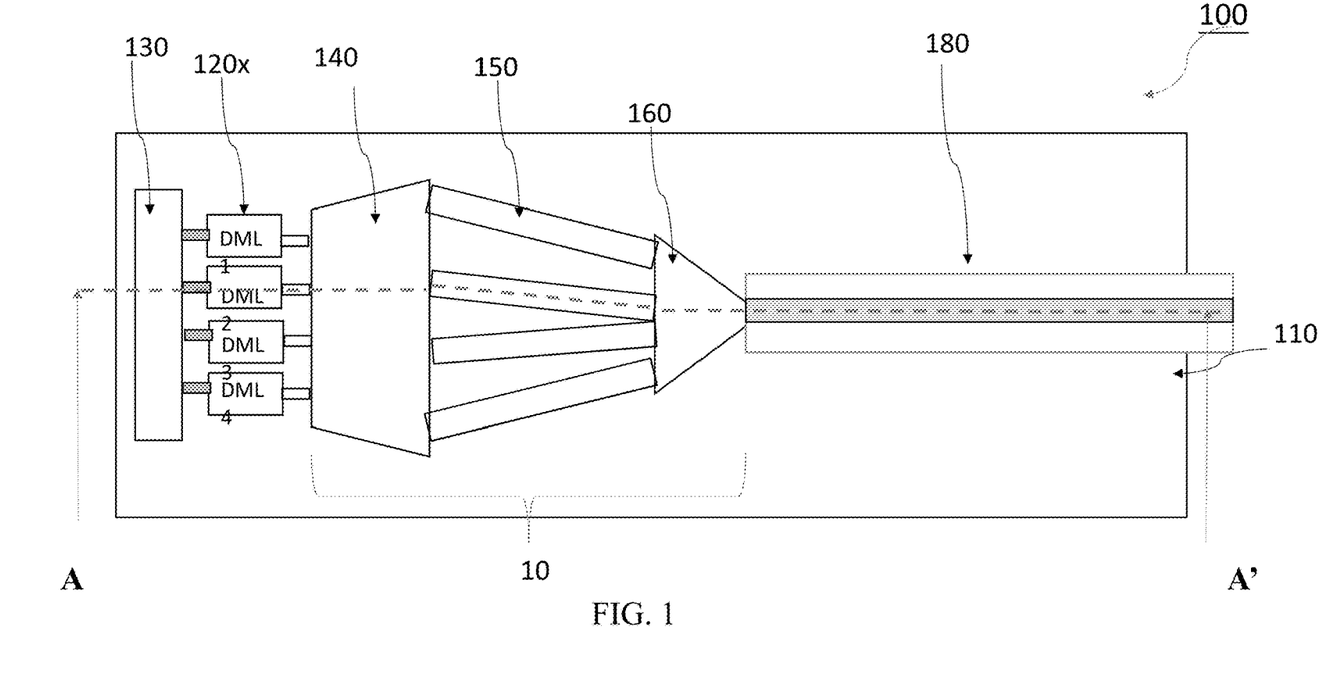
FIG. 1 illustrates a schematic diagram of an optical transmitter device in accordance of a disclosed embodiment.
Figure 2:
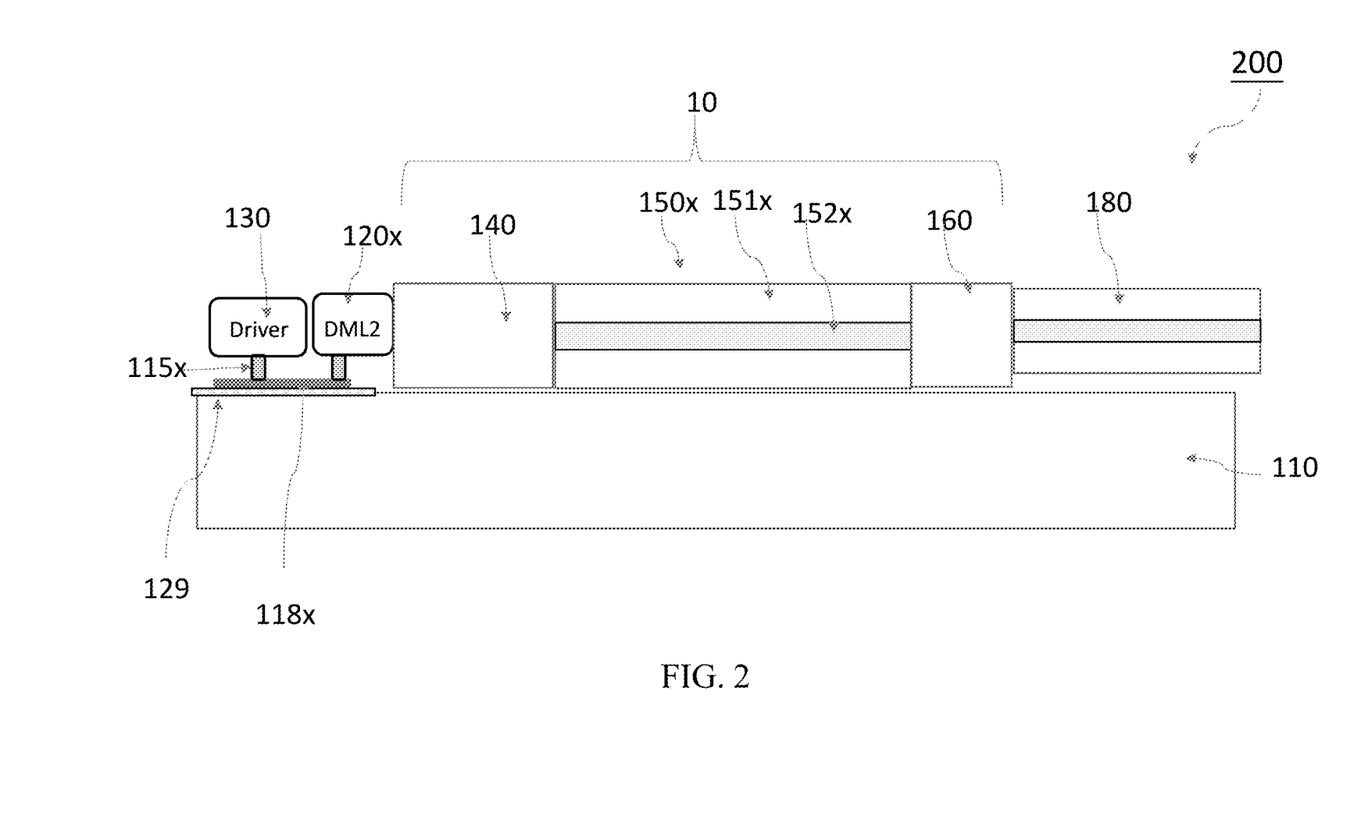
FIG. 2 illustrates a schematic diagram of the cross sectional view along line AA' of the optical transmitter device in accordance of the disclosed embodiment in FIG. 1.

FIG. 1 illustrates a schematic diagram of an optical transmitter device in accordance of a disclosed embodiment. FIG. 2 illustrates the cross sectional view along line AA' of the optical transmitter device in accordance of the disclosed embodiment in FIG. 1.

In FIG. 1, a substrate 110 provides a support base for the transmitter. The substrate can be a silicon wafer, a glass or a SOI wafer, or a combination of one of them and one metal plate to add additional mechanical strength. The Metal plate maybe made of stainless steel or another compatible metal. For exemplary reasons, a silicon substrate is referred to in the description. Referring now to FIG. 1, a schematic top view illustration is provided of a coupling structure of a silicon substrate based optical transmitter device connecting an array of edge emitting lasers to a single mode fiber via an array-wavelength-grating (AWG) polymer waveguides in accordance with a disclosed embodiment. The optical coupling structure 100 may be mounted to bonding pads on a flexible printed circuit (FPC not shown in FIG. 1). The lasers 120x and laser driver 130 are connected by high frequency transmission lines 118x via solder bumps 115x in FIG. 2. The transmission lines are metal lines laid out in an insulating layer on the silicon top surface. The insulating layer can be an organic film such as a polyimide layer. The array of edge emitting lasers 120x includes AlGaAs semiconductor lasers, distributed feedback lasers (DFB), or tunable solid state lasers, which are frequency modulated either directly or externally. The difference between a directly modulated laser (DML) and an externally modulated laser is that a DML is modulated by current injected from its driver circuit versus that an externally modulated laser emits continuous light output which is then frequency controlled by an external device. DMLs are compact and used widely in optical communication systems. In FIG. 1, the four direct modulated lasers DML1, DML2, DML3 and DML4 emit four different wavelengths, exemplarily at 1290 nm, 1310 nm, 1330 nm, and 1350 nm.

The multiple wavelengths from the array of lasers are multiplexed by a polymer based AWG into an optical output of a single mode fiber (SMF) 180. Array waveguide gratings (AWG) are commonly used as optical multiplexers or demultiplexers in wavelength division multiplexed (WDM) systems. These devices are capable of multiplexing a large number of wavelengths into a single optical fiber at the transmission end, and are also used as demultiplexers to retrieve individual channels of different wavelengths at the receiving end of an optical communication network, thereby increasing the transmission capacity of optical networks considerably.

A multiplexing polymer AWG 10 as shown in FIG. 1 consists of a number of input ports and one output port, a high NA (numerical aperture) free space propagation polymer waveguide 140, a number of polymer grating waveguides 150, and a polymer coupler 160. The input ports couple to light from four directly modulated lasers 120x at four wavelengths. The output port couples to a single mode fiber 110. The high NA (numerical aperture) polymer waveguide 140 allows light of all wavelengths interfere and propagate through the free-space region and illuminate the polymer grating waveguides 150 with a Gaussian distribution. The polymer grating waveguides 150 consist of a large number of waveguides with a constant length increment. Each wavelength of light coupled to one of the polymer grating waveguides undergoes a constant change of phase attributed to the constant length increment in the polymer grating waveguides 150. The polymer coupler 160 mixes and projects light from all waveguide gratings into the single mode fiber 110.

FIG. 2 shows the cross sectional view along line AA' in FIG. 1. As shown, conductive lines 118x link DML lasers 120x and their driver 130 via solder bumps 115x. Silicon is a semiconductor, any electronic connection on a silicon surface needs to be insulated from the silicon base. The insulating layer 129 is disposed on the top surface of the silicon substrate 110. Every one of the polymer waveguide gratings 150x has a polymer core region 152x surrounded by polymer cladding regions 151x which have a refractive index lower than that of the core region 152x. The polymer core region may be a strip structure which has a circular or a rectangular cross section surrounded by a cladding outside structure. A polymer core 152x is typically made of polymeric materials which exhibit relatively high dielectric constant (typically >2.5) such as polyimide, polystyrene, Mylar, and electroactive polymers, etc. A polymer cladding 151x is often made of lower dielectric constant (typically <2.4) polymer materials, for example, PTFE, Teflon, polyethylene, polypropylene, and electroactive polymers (with lower index of refraction).

The optical path in polymer AWG 10 includes the high NA polymer waveguide 140 and the polymer coupler 160 at the ends of the polymer waveguide gratings 150x. The polymer materials in the optical path are designed to be either having the same or very close dielectric constants to reduce loss at the interface.

Figure 3:
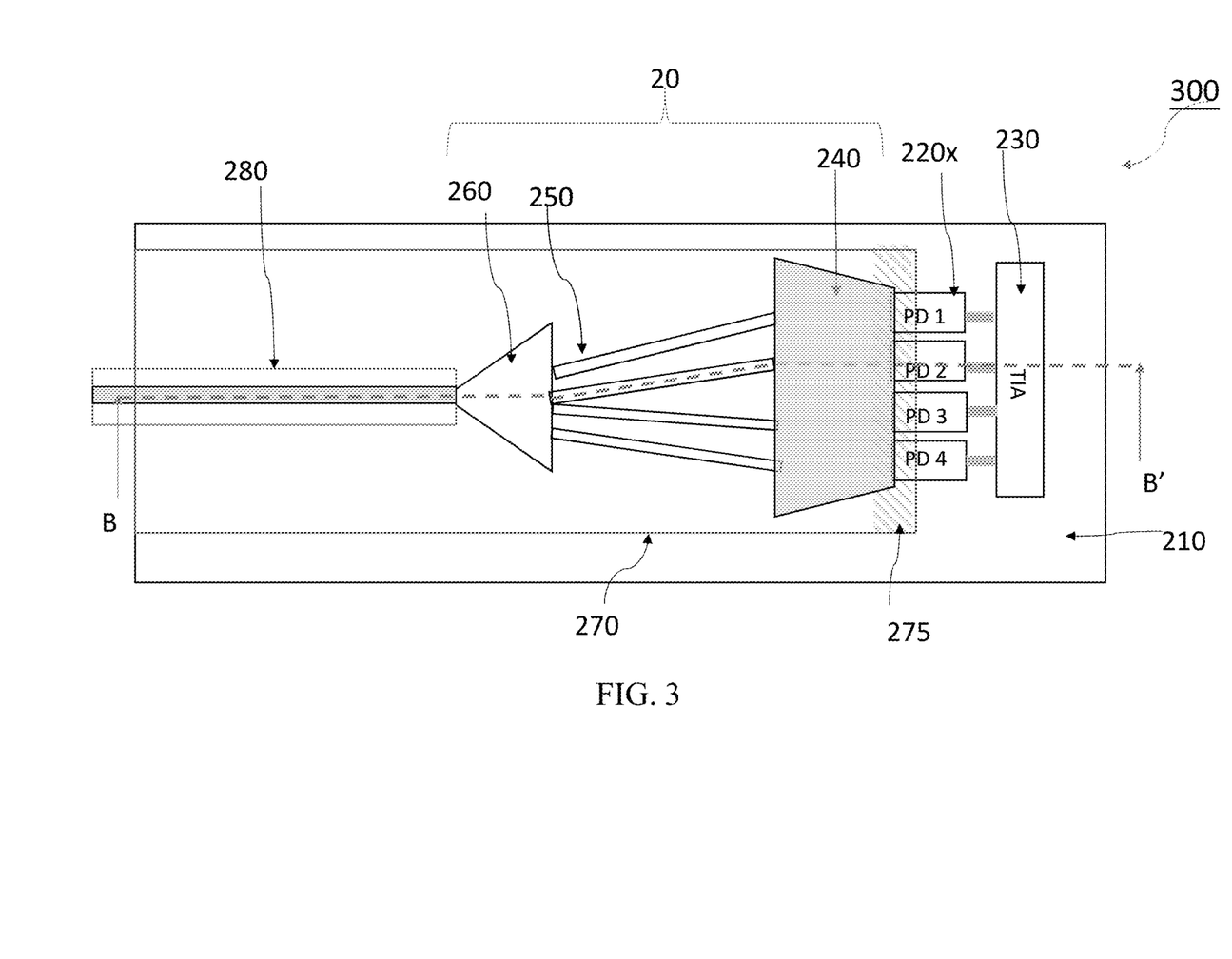
FIG. 3 illustrates a schematic diagram of an optical receiver device in accordance of a disclosed embodiment.
Figure 4:
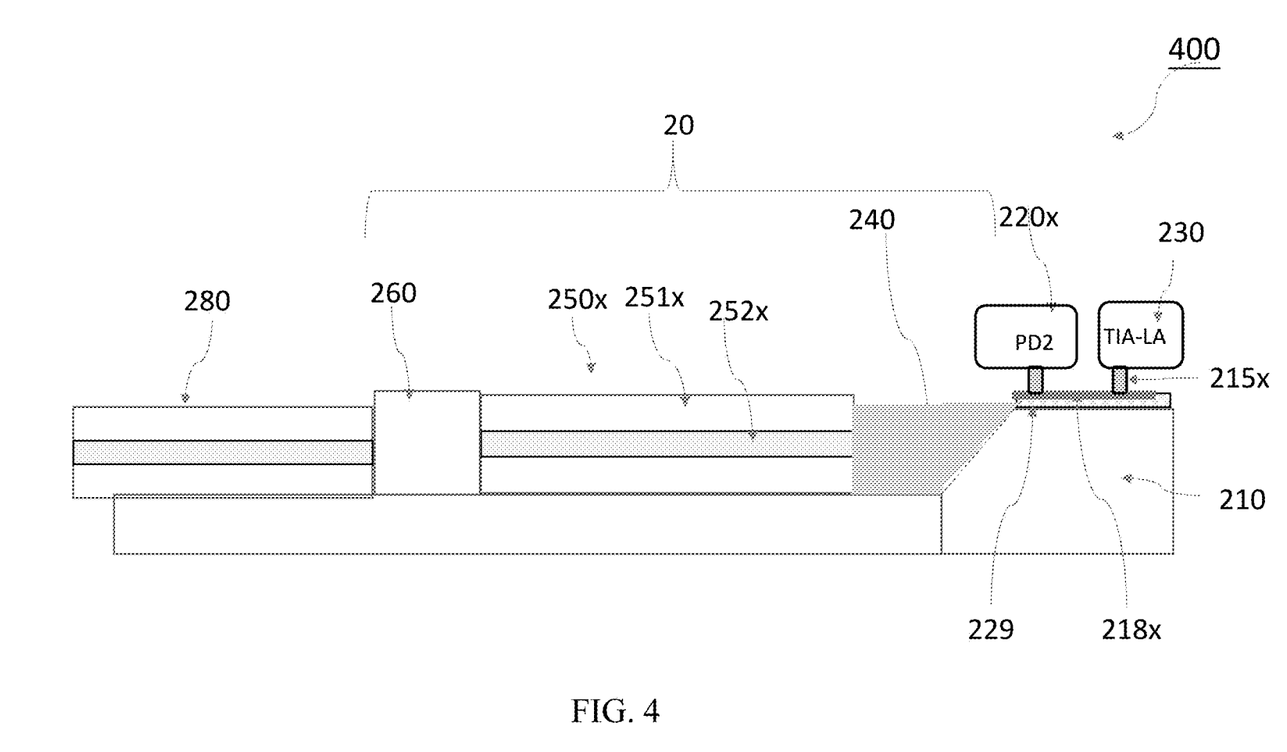
FIG. 4 illustrates a schematic diagram of the cross sectional view along line BB' of the optical receiver device in accordance of the disclosed embodiment in FIG. 3.

FIG. 3 illustrates a schematic diagram of an optical receiver device 300 in accordance of a disclosed embodiment. FIG. 4 illustrates a schematic diagram of the cross sectional view along line BB' of the optical receiver device in accordance of the disclosed embodiment in FIG. 3.

In FIG. 3, a substrate 210 provides a support base. The substrate can be a silicon wafer or a SOI wafer. On the top surface, a trench 270 is formed to accommodate optical passive devices including an input single mode fiber 280, a demultiplexing polymer AWG 20, an array of photodetectors 220 and trans-impedance amplifier 230. The trench 270 has a slanted one side wall 275 near the photodetectors. The slanted slope helps to reflect light from the AWG output into the array of photodetectors 220. The angle is approximately set at 45 degree but is not limited.

The demultiplexing polymer AWG 20 as shown in FIG. 3 consists of one input port and a number of output ports, a polymer input coupler 260, a number of polymer waveguide gratings 250, and a high NA (numerical aperture) free space propagation polymer waveguide 240. The polymer input coupler 260 couples to light from the single mode fiber 180 where light of all wavelengths mixes to illuminate the array polymer waveguide gratings 250. Similar to the multiplexing waveguide gratings 150 for the transmitter described before, the receiver polymer waveguide gratings 250 consist of a large number of polymer waveguides with a constant length increment. Each wavelength of light coupled to one of the polymer grating waveguides undergoes a constant change of phase attributed to the constant length increment in the polymer grating waveguides 250. Light diffracted from each waveguide of the polymer gratings interferes high NA in polymer waveguide 240 constructively and gets refocused into wavelength dependent beam directions. The output light is reflected by the slanted side wall 275 of the silicon trench 270 into the four photodetectors 220x, i.e. PD1, PD2, PD3, and PD4.

FIG. 4 shows the cross sectional view of the optical receiver device along line BB' in FIG. 3. As shown, wavelength mixed light enters the receiver 400 from the single mode fiber 280, spread by another high NA coupler 260, into the polymer waveguide gratings 250x. Every waveguide of the polymer waveguide gratings 250x has a polymer core region 252x surrounded by polymer cladding region 251x which has a refractive index lower than that of the core region 252x to ensure total internal reflection. The polymer core region may include a strip structure and a slanted end reflector structure resting on the slanted side wall 275 of the silicon trench 270. The core region 252x has a circular or a rectangular cross section surrounded by a cladding outside structure. The high NA polymer structure 240 may be formed of one polymer material without cladding, although the second polymer material applied as a clad is possible. A polymer core 252x is typically made of polymeric materials which exhibit relatively high dielectric constant (typically >2.5) such as polyimide, polystyrene, Mylar, and electroactive polymers, etc. A polymer cladding 251x is often made of lower dielectric constant (typically <2.4) polymer materials, for example, PTFE, Teflon, polyethylene, polypropylene, and electroactive polymers (with lower index of refraction).

The conductive lines 218x link photodetectors 220x and their trans-impedance amplifier 230 via solder bumps 215x. The insulating layer 229 is disposed on the top surface of the silicon substrate 210 under the conductive lines 218x to isolate it from the semiconductor silicon base. This insulating layer 229 may include an organic film like a polyimide layer. The solder bumps 215x have gold or nickel coatings. The conductive lines are typically metal lines made of gold, copper, aluminum, titanium, nickel, stainless steel, or an alloy.

Figure 5:
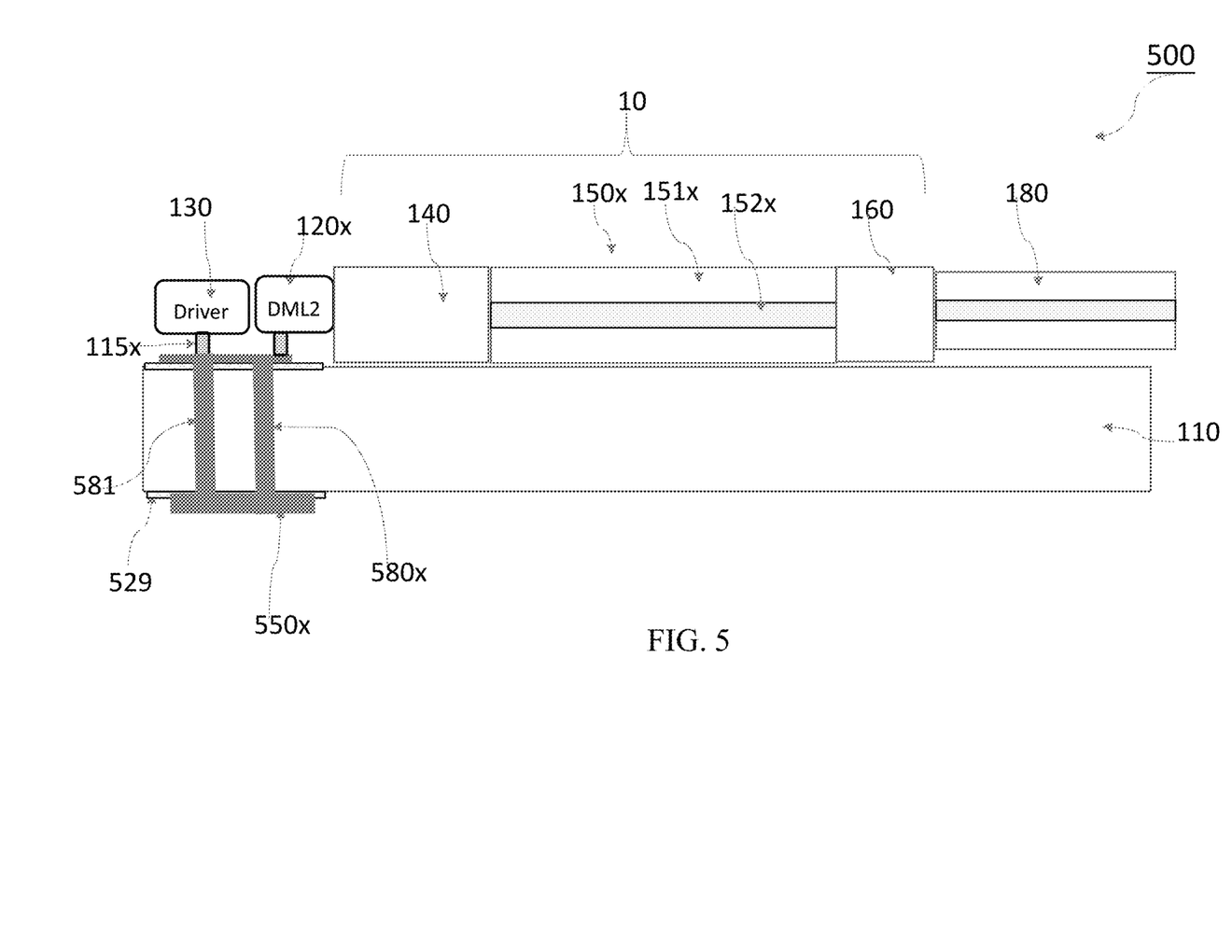
FIG. 5 illustrates a schematic diagram of the cross sectional view of an optical transmitter device having TSV access from backside of the substrate in accordance of an embodiment the disclosure.

FIG. 5 illustrates a schematic diagram of the cross sectional view of an optical transmitter device 500 having TSV access from backside of the substrate, in accordance of another embodiment the disclosure. Electrical connections for the DML lasers 120x and the driver circuit 130 to external power suppliers are provided by a number of through-silicon-vias (TSVs) 580x and 581. An insulating layer 529 is disposed at the back side of the silicon substrate 110. A set of connecting lines 550x on the insulating layer 529 are packaged to external power circuits. As an option, this packaging technique may provide convenience and low cost in manufacturing.

In utilizing the various aspects of the embodiments, it would become apparent to one skilled in the art that combinations or variations of the above embodiments are possible for fabricating optical coupling structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical interconnect transmitter structure on a surface of a silicon substrate, comprising:
    a plurality of laser diodes emitting different wavelengths;
    a driving circuit powering the plurality of laser diodes;
    a single mode fiber;
    a polymer array waveguide grating (AWG) multiplexer, comprising:
        an input high NA (numerical aperture) polymer element mixing the different wavelengths;
        a plurality of polymer waveguides arranged to have different lengths;
        an output high NA polymer element for propagating light into the single mode fiber; and
    first conductive lines built on an insulating layer on the silicon surface, wherein the first conductive lines connect the driver circuit to the plurality of laser diodes; and
    a plurality of through-silicon-vias (TSVs) which interconnects the driving circuit and the plurality of laser diodes to second conducting lines located at a backside of the silicon substrate;
    wherein an optical path is formed from the plurality of laser diodes to the single mode fiber through the polymer AWG multiplexer.

2. An optical interconnect system, comprising:
    a single mode fiber having a first end connecting to a transmitter on a first silicon substrate and a second end connecting to a receiver on a second silicon substrate;
    wherein the transmitter comprises:
    a plurality of laser diodes emitting different wavelengths;
    a polymer array waveguide grating (AWG) multiplexer, wherein the polymer AWG multiplexes the different wavelengths into the first end of the single mode fiber;
    wherein the receiver comprises:
    a polymer array waveguide grating (AWG) demultiplexer, wherein the polymer AWG demultiplexer inputs the different wavelengths from the single mode fiber and demultiplexes the different wavelengths into a plurality of photodetectors; a trench formed on the second silicon substrate, wherein a side wall of the trench has a slanted slope, wherein the polymer AWG demultiplexer is arranged in the trench; and
    a plurality of photodetectors connected to a trans-impedance amplifier circuit in an area outside the trench; and
    wherein the polymer AWG demultiplexer comprises:
        a second input polymer element receiving light of different wavelengths from the single mode fiber and illuminating the light into a plurality of polymer waveguides;
        a plurality of second polymer waveguides arranged to have different lengths; and
        a second output high NA polymer element for demultiplexing light, wherein the second output high NA polymer element has an end reflector resting on the slanted slope of the trench for directing light into the plurality of photodetectors;
    wherein an optical path is formed from the second end of the single mode fiber to the plurality of photodetectors through the polymer AWG demultiplexer.

3. The optical interconnect system as in claim 2, wherein the slanted angle of the slanted side wall of the trench is approximately 45 degrees.

4. An optical interconnect system, comprising:
    a single mode fiber having a first end connecting to a transmitter on a first silicon substrate and a second end connecting to a receiver on a second silicon substrate;
    wherein the transmitter comprises:
    a plurality of laser diodes emitting different wavelengths;
    a polymer array waveguide grating (AWG) multiplexer, wherein the polymer AWG multiplexes the different wavelengths into the first end of the single mode fiber; and
    wherein the receiver comprises:
    a polymer array waveguide grating (AWG) demultiplexer, wherein the polymer AWG demultiplexer inputs the different wavelengths from the single mode fiber and demultiplexes the different wavelengths into a plurality of photodetectors;

wherein the plurality of laser diodes are direct modulated lasers (DML) directly modulated with driving current from a driving circuit; and wherein the transmitter further comprises a plurality of through-silicon-vias (TSVs) which interconnect the plurality of laser diodes and the driving circuit to conducting lines located at a backside of the first silicon substrate.

\* \* \* \* \*